United States Patent [19]

Nakatani et al.

[11] 4,203,025
[45] May 13, 1980

[54] THICK-FILM THERMAL PRINTING HEAD

[75] Inventors: Mitsuo Nakatani; Takashi Kuroki, both of Yokohama; Toshiaki Syozi, Kanagawa; Yoshiyuki Horibe, Hitachi, all of Japan

[73] Assignee: Hitachi, Ltd., Japan

[21] Appl. No.: 934,368

[22] Filed: Aug. 17, 1978

[30] Foreign Application Priority Data

| Aug. 19, 1977 [JP] | Japan | 52-98658 |
| Aug. 19, 1977 [JP] | Japan | 52-98659 |
| Aug. 24, 1977 [JP] | Japan | 52-112301[U] |

[51] Int. Cl.² .................................. H05B 1/00
[52] U.S. Cl. .................................. 219/216; 219/543; 338/309; 346/76 PH
[58] Field of Search ................. 219/216, 543; 338/307–309; 346/76 PH; 252/518; 427/96, 101–103; 29/611

[56] References Cited

U.S. PATENT DOCUMENTS

| 3,370,262 | 2/1968 | Marty et al. | 338/309 |
| 3,967,092 | 6/1976 | Conta et al. | 219/216 |
| 3,984,844 | 10/1976 | Tanno et al. | 219/216 X |
| 4,016,525 | 4/1977 | Maher et al. | 338/309 |
| 4,030,408 | 6/1977 | Miwa | 219/216 X |

OTHER PUBLICATIONS

Susumu Shibata, *IEEE Transactions on Parts, Hybrids and Packaging*, "New Type Thermal Printing Head Using Thin Film", vol. PHP-12, No. 3, Sep. 1976, pp. 223–230.

*Primary Examiner*—C. L. Albritton
*Attorney, Agent, or Firm*—Craig and Antonelli

[57] ABSTRACT

Glass including 10–60% by weight of at least one metal oxide selected from the group consisting of $Al_2O_3$, MgO, $ZrO_2$, BeO and $TiO_2$ is formed, as a heat-insulator, on a substrate. Plural pairs of electrodes, each laterally facing to tne other, are formed on the glass, heating resistors are formed between the electrodes of each pair, and the electrodes and the resistors are covered by a protective layer formed of glass including 10–40% by weight of at least one metal oxide selected from the group consisting of $Al_2O_3$ and BeO to complete a thick-film thermal printing head.

17 Claims, 14 Drawing Figures

THICK-FILM THERMAL PRINTING HEAD

BACKGROUND OF THE INVENTION

1. Field of the Invention

The present invention relates to a thick-film thermal printing head, and more particularly to heat insulating layers and protective layers thereof.

2. Description of the Prior Art

A basic structure of a thick-film thermal head for a thermal printer used in thermal printing comprises, as illustrated in an example shown in FIG. 1, a ceramic substrate 1, a pair of opposing electrodes 2 formed thereon, a resistor 3 serving as a heat generating element, formed between the electrodes 2 and a protective layer or abrasion-resistant layer 4 formed on the electrodes 2 and the resistor 3 to cover the same. In this type of thermal head, a pulse current is supplied to the resistor 3 to cause it to generate heat so that Joule heat thereof causes to change color of a heat-sensitive paper 6 which is urged to the protective layer 4 by a paper feed roller 5.

A first problem encountered in this type of thermal head is that since heat conductivity of the ceramic substrate (which is usually an alumina substrate or a folsterite substrate) is about 30 times as high as heat conductivity of the protective layer (glass layer) 4 formed on the resistor 3 (e.g. $5 \times 10^{-2}$ cal/cm.sec.°C. for alumina), most parts of heat generated by the resistor are absorbed by the substrate and only 5-10% of the total heat generated is conducted to the heat-sensitive paper.

Thus, in order to attain a desired optical density for printing, power supplied to the resistor must be increased. However, the increased power leads to the reduction of durability of the resistor (which is usually a ruthenium oxide thick-film resistor), that is, the change of resistance during printing and also leads to the increase of cost due to a larger power supply required. In order to reduce the necessary power for printing, it is the most effective way to minimize the escape of the heat generated by the resistor 3 to the ceramic substrate 1. To this end, in a thin-film thermal head, it has been proposed to form a heat insulating layer 7 of poor heat conductivity between the resistor 3 and the ceramic substrate 1, as shown in FIG. 2. The heat insulating layer 7 is usually made of nonalkali glass having a thickness of approximately 30 to 60 μm. See for example, S. Shibata, K. Murasugi and K. Kaminishi, "New type thermal printing head using thin film," IEEE Transactions on Parts, Hybrids, and Packaging, Vol. PHP-12, No. 3, pp. 223-230 Sept. 1976. In the thick-film thermal head, it is also very effective to form the heat insulating layer 7 in improving heat utilization efficiency during printing, but it has been found that since the materials used and the manufacturing processes differ between the thick-film thermal head and the thin-film thermal head, there is involved a serious problem when the heat insulating layer of the thick-film thermal head is made of the nonalkali glass as in the thin-film thermal head. That is, the thick-film thermal head for thermal printing having heat insulating layer 7 may be manufactured by applying glass paste (consisting of lead borosilicate glass frits and α-terpineol solution of ethyl cellulose) on the ceramic substrate (comprising 96% of alumina) 1 to a desired thickness by printing or the like, firing the paste to form the heat insulating layer 7, printing silver thick-film conductive paste (consisting of gold powder, bismuth containing-lead borosilicate glass frits and α-terpineol solution of ethyl cellulose) or Pd-Ag thick-film conductive paste (consisting of palladium powder, silver powder, bismuth containing-lead borosilicate glass frits and α-terpineol solution of ethyl cellulose) and firing the paste to form the electrodes 2, printing ruthenium oxide thick-film resistor paste (consisting of $RuO_2$ powder, lead borosilicate glass frits and α-terpineol solution of ethyl cellulose) and firing the paste to form the resistor 3, and printing thick-film glass paste (consisting of lead borosilicate glass frits and α-terpineol solution of ethyl cellulose) and firing the paste to form the abrasion protective layer 4. However, it has been found that during the manufacturing process the resistance of the resistor is considerably increased during the firing process by the influence of the heat insulating layer.

For example, when the heat insulating layer 7 is formed by printing and firing the glass paste consisting of lead borosilicate glass frits and an α-terpineol solution of ethyl cellulose and the resistor 3 is formed by printing and firing the resistor paste ($RuO_2$ thick-film paste described above), the resistance of the resistor 3 increases approximately ten times as high as that when the heat insulating layer is not formed. It has also been found that the variance of the resistance of the resulting resistor is so large that it cannot be used as the heat generator for the thermal printing head.

A second problem encountered in a thermal head built in a hybrid circuit substrate is that when the electrodes 2 are formed on the heat insulating layer 7 having a thickness of 30 to 60 μm as shown in FIG. 3, the electrodes 2 spread as shown in FIGS. 3 and 4 to cause short of the electrodes. As an approach to solve the above problem, it has been proposed to form the heat insulating layer 7 on the entire surface of the ceramic substrate 1 to prevent a step from being formed between the heat insulating layer 7 and the surface of the substrate 1, but this approach involves a problem that a large amount of expensive glass paste is required and that when semiconductor chips or the like are to be mounted on the substrate it becomes more difficult to dissipate heat generated by the semiconductor chips to the substrate.

A third problem resides in the protective layer. In FIG. 2, since the protective layer 4 serves to prevent the wear loss of the heat generating resistor due to the feed of the heat-sensitive paper 6, the protective layer 4 itself must be highly wear-resistant. However, the glass material usually used for the protective layer 4 (lead borosilicate glass having a softening point of 480°-500° C.) is worn by as much as approximately 10 μm through the paper feed of approximately 5 Km. For the abrasion resistance of the glass material to the paper feed, it is necessary that the glass layer remains after the paper feed of 25 Km, and in order to meet the requirement by the conventional glass, the glass layer thickness of approximately 50 μm is required. However, when the thickness of the glass layer is so increased, it becomes harder for the heat generated in the resistor 2 to be conducted to the heat-sensitive paper 6 because the heat conductivity of glass is low, i.e., $2 \times 10^{-3}$ cal/°C.cm.sec, and hence, the power to be supplied to the resistor 3 for printing must be increased. The increase of the power leads to the change of resistance of the resistor 3 and reduction of the durability.

The protective layer 4 has been heretofore formed by applying the glass paste (consisting of lead borosilicate glass frits and an α-terpineol solution of ethyl cellulose) on the resistor 3 (e.g., the RuO$_2$ thick-film resistor described above) and the electrodes 2 (e.g., the Ag-Pd electrodes described above) to a desired thickness by screen printing or the like, drying the paste and firing the paste at 500° to 600° C. However, when the glass is fired, the resistor is refired and the resistance of the resistor changes. The change of the resistor occurs when the glass firing temperature exceeds 500° C., and the degree of the change increases as the firing temperatures rises. Accordingly, in order to attain a preset magnitude of the resistance, the resistor must be formed taking the change of resistance by refiring into consideration. This is very troublesome and also difficult to obtain the preset magnitude of the resistance. As the resistance of the resistor varies one from the other, the amount of heat generated when a pulse of a given voltage is applied to the resistor 3 differs are one from the other and hence the optical density for printing is not uniform. Accordingly, it is desirable that the material of the protective layer 4 is one which can minimize the change of resistance of resistor 3 when the material is fired.

Furthermore, as described above, the material of the protective layer heretofore used has a low heat conductivity such as approximately $2 \times 10^{-3}$ cal/°C.cm.sec. so that even if the thickness is limited to 15 μm, only about 10% of the heat generated in the resistor can be utilized to change color of the heat-sensitive paper because of a heat insulating effect of the protective layer. Thus, the heat utilization efficiency is poor.

SUMMARY OF THE INVENTION

It is an object of the present invention to provide a thick-film thermal printing head for a thermal printer which overcomes the problems encountered in the prior art thermal heads and having (i) a heat insulating layer which does not adversely affect the resistance of a heating resistor, is hard to cause short of electrodes and provides good heat dissipation of semiconductor chips mounted on a substrate, and (ii) a protective layer which does not adversely affect the resistance of the resistor, is highly wear-resistant and has high thermal conductivity.

In order to attain the above objects, the inventors of the present invention have made an extensive study and have found that when glass including 10 to 60% by weight of at least one metal oxide as a refractory filler selected from the group consisting of Al$_2$O$_3$, MgO, ZrO$_2$, BeO and TiO$_2$ is used as the material for the heat insulating layer and the thick-film resistor is printed thereon and fired, there is little difference between the resulting resistance and that obtained by printing the resistor on the substrate without the heat insulating layer and firing the resistor and hence the resistor with smaller variance in the resistance can be obtained, that the thickness of the heat insulating layer is preferably 10 to 80 μm and more preferably the section of the heat insulating layer is of at least two-step shape or multilayer structure with the height of one step being no larger than 25 μm, and that it is very effective to form the protective layer by glass including 10 to 40% by weight of at least one metal oxide selected from the group consisting of Al$_2$O$_3$ and BeO. The thickness of the protective layer is 4 to 20 μm and preferably 4 to 6 μm.

The glasses used for the heat insulating layer and the protective layer in the present invention are preferably borosilicate glass, Na containing-borosilicate glass, lead borosilicate glass, Na containing-lead borosilicate glass or bismuth containing-lead borosilicate glass.

When the thickness of the heat insulating layer is thicker than 80 μm, the temperature of the entire thermal head exceeds 60° C. and the heat-sensitive paper changes color even when power is not supplied to the resistor. When the thickness is thinner than 10 μm, the power supplied to the resistor is so high that currents flowing in semiconductor devices mounted on the thermal head exceed the allowable current capacity. Consequently, the thickness range of 10 to 80 μm is preferable.

When the heat insulating layer is thicker than 25 μm, the section thereof preferably has at least two-step shape with the height of the first step on the side of the substrate being 10 to 25 μm and the height of each of the second and following steps being no larger than 25 μm. With this arrangement, there occurs no short between adjacent electrodes when 6 plural pairs of electrodes having an electrode width of 0.05 to 0.10 mm and an electrode spacing of 0.05 to 0.10 mm are formed.

When the protective layer is thinner than 4 μm, it is worn away through the paper feed of the heat-sensitive paper of 25 Km. Accordingly, the thickness is preferably no less than 4 μm. The thicker the thickness is, the longer is the durability of the protective layer, but when it is thicker than 20 μm, the heat dissipation is poor and supply power to be applied increases. Therefore, the thickness of 4 to 20 μm is practically preferable.

DETAILED DESCRIPTION OF THE PREFERRED EMBODIMENTS

Several embodiments of the present invention will now be described with reference to the drawings.

Embodiment 1

Figure 1:
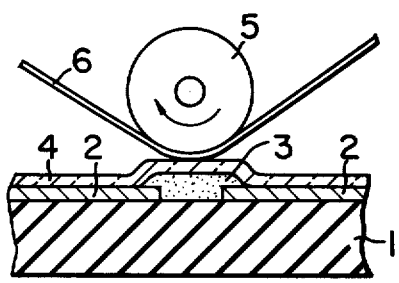
FIG. 1 is a sectional view of a prior art thick-film thermal printing head.
Figure 2:
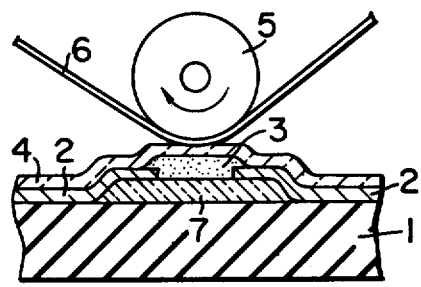
FIG. 2 is a sectional view of a prior art thin-film thermal printing head.
Figure 3:
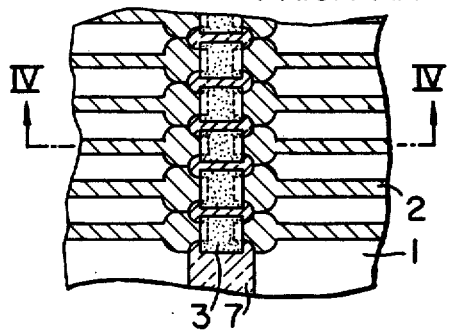
FIG. 3 shows an example where adjacent ones of a plurality of pairs of opposing electrodes are shorted in the prior art thick-film thermal head.
Figure 4:
FIG. 4 is a sectional view taken along a line IV—IV in FIG. 3.
Figure 5:
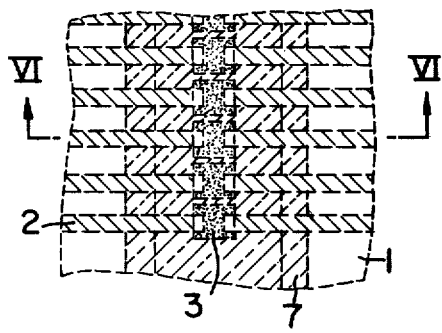
FIG. 5 shows a plan view of a hybrid-type thick-film thermal printing head having an array of resistors according to an embodiment of the present invention.
Figure 6:
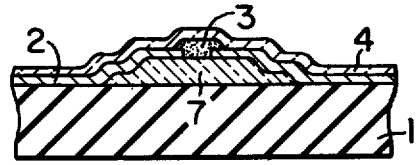
FIG. 6 is a sectional view taken along a line VI—VI in FIG. 5.

In manufacturing the hybrid-type thermal head as shown in FIGS. 5 and 6, composition of the paste for forming a heat insulating layer 7 used in the experiment consists of 100 parts by weight of lead borosilicate glass frits, 20 parts by weight of ethyl cellulose (100 cps), 180 parts by weight of α-terpineol and 0–80 parts by weight of at least one metal oxide selected from the group consisting of Al$_2$O$_3$, MgO, ZrO$_2$, BeO and TiO$_2$. The paste is prepared by previously mixing the glass frits with the metal oxide described above, blending the mixture with an α-terpineol solution of ethyl cellulose in a blender for two hours and passing the resulting mixture through roll-mill (three times).

Each of various pastes (having different types of filler and different compounding ratios) prepared in this manner is printed twice in overlapped manner on a ceramic (comprising 96% of alumina) substrate 1 through a 165 mesh stainless steel screen, as shown in FIGS. 5 and 6, dried at 125° C. for 20 minutes and then fired at 930° C. to form the heat insulating stepwise layer 7 having a total thickness of 40 μm. The thickness of each step of the layer 7 is 20 μm.

The surface of the heat insulating layer 7 is lapped by alumina abrasive grains having grain size of #500 to grind the surface of the heat insulating layer. On the heat insulating layer 7 which has been reduced to a thickness of approximately 35 μm through lapping, conductive paste consisting of gold powder, bismuth containing-lead borosilicate glass and an α-terpineol solution of ethyl cellulose is printed, dried at 125° C. for 20 minutes and then fired at 900° C. to form electrodes 2. Each electrode 2 has a width of 80 μm and a thickness of 6 μm. The spacing between adjacent electrodes is 85 μm.

Between the electrodes 2, resistive paste (consisting of $RuO_2$ powders, lead borosilicate glass frits and α-terpineol solution of ethyl cellulose) is printed, dried at 125° C. and then fired at 850° C. to form resistors 3 which serve as heat generators. Each resistor 3 has an area of 120×400 μm$^2$ and a thickness of 30 μm and has a resistance of 300 Ω. On the resistor 3, glass paste consisting of a mixture of 20% by weight of $Al_2O_3$ and 80% by weight of lead borosilicate glass frits and α-terpineol of ethyl cellulose is printed, dried at 125° C. for 20 minutes and then fired at 600° C. to form an abrasion protective layer 4 having a thickness of 15 μm.

In the manner described above, the thick-film thermal head for thermal printer with the heat insulating layer was manufactured and measured for the change of resistance during firing of the resistor and power to be supplied to the resistor in order to attain a constant optical density in actual printing.

The results of the measurement are now explained.

Figure 8:
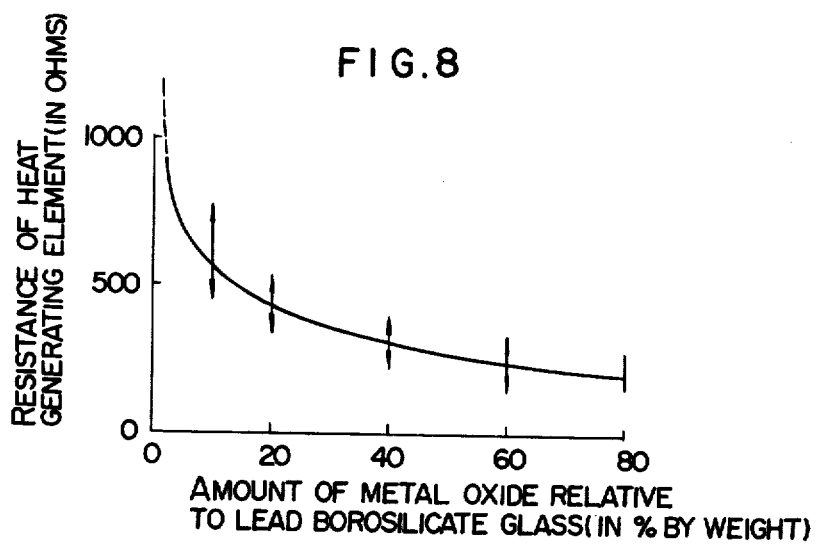
FIGS. 8 through 13 show experimental data in accordance with the present invention.

FIG. 8 shows the changes of resistances of the resistors on the heat insulating layer formed by preparing paste consisting of various mixtures having different amounts of metal oxide (e.g., $Al_2O_3$) added to lead borosilicate glass, and printing and firing the paste, as described above. It has been proved that a trend shown in FIG. 8 is observed both when any one of the metal oxides $Al_2O_3$, MgO, $ZrO_2$, BeO and $TiO_2$ is added singly and when combination of those metal oxides are added, and that the more the amount of addition of the metal oxide is, the less is the change of the resistance of the resistor when it is formed by printing and firing the resistive paste.

It has also been proved that when the amount of addition of the metal oxide is no less than 10% by weight, the variance of the resistance is small and no practial problem is raised.

Figure 9:
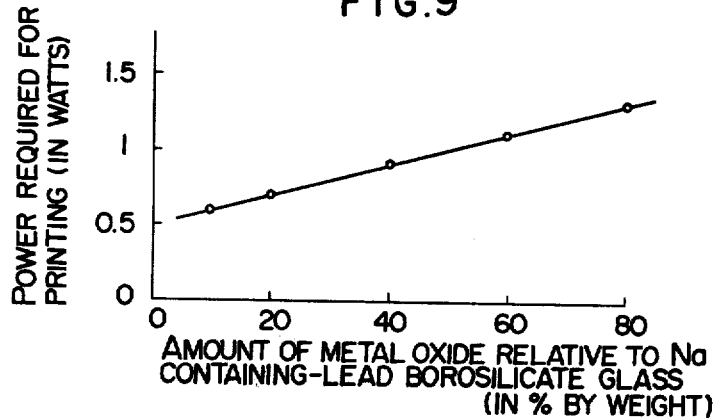

The thermal head manufactured was then tested for printing to measure power necessary to obtain an optical density of 1.0 for printed image (using a Macbess reflection density meter). It has been proved that the relation shown in FIG. 9 is obtained when any of the metal oxides is used singly or when combination thereof is used. It has also been proved that the less the amount of addition of the metal oxide is, the less power is required for printing, and when the amount of addition is no larger than 60% by weight, print having an optical density of no less than 1 can be attained by the power of no larger than 1 watt.

From the above, it has been proved that the amount of addition of the metal oxide to the glass composition is preferably between 10 and 60% by weight, inclusive.

Embodiment 2

Figure 7A:
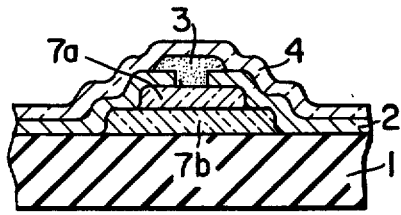
FIGS. 7A and 7B are sectional views of thick-film thermal printing heads according to other embodiments of the present invention, respectively.
Figure 7B:
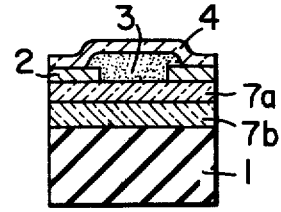

FIG. 7A illustrates a modification of FIG. 6, and FIG. 7B illustrates a section of a thermal head unit having an array of resistors used as a discrete component.

Similarly to Embodiment 1, paste having an amount of addition of metal oxide to the glass of less than 10% by weight is prepared, printed on an alumina substrate 1 to a thickness of 20 μm, dried at 125° C. for 20 minutes and then fired at 930° C.

Then, paste having an amount of addition of the metal oxide of 40% by weight is printed on the fired paste to a thickness of 20 μm, dried at 125° C. for 20 minutes and fired at 930° C. to form a double-layer structure consisting of heat insulating layers 7a and 7b as shown in FIG. 7A or FIG. 7B. As in Embodiment 1, an electrode layer 2, a heating resistor layer 3 and a protective layer 4 are formed on the double-layers. The change of resistance of the resistor 3 during firing of the resistor and power necessary for printing were measured. It has been proved that the change of resistance of the resistor 3 during firing of the resistor is the same as that when 40% by weight of metal oxide is included in the heat insulating layer. Thus, even when the heat insulating layer is of double-layer structure having the first layer 7b and the second layer 7a as in FIG. 7A or FIG. 7B, the change of resistance of the resistor can be reduced as in the Embodiment 1 by adding 10–60% by weight of metal oxide to the topmost layer 7a of the heat insulating double-layers.

The thermal heat having a double-layer (7a and 7b) consisting of the first layer 7b of glass containing less than 10% by weight of $Al_2O_3$ and the second layer 7a of glass containing 40% by weight of $Al_2O_3$, was tested for printing and it has been proved that the necessary power for attaining an optical density of 1.0 was 0.7 watts.

It is seen from FIG. 9 that the power of 0.9 watts is necessary to attain an optical density of 1.0 by the heat insulating double-level glass layer including 40% by weight of $Al_2O_3$. Thus, it has been proved that the printing efficiency is improved by the double-layer structure having one layer including less than 10% by weight of metal oxide and the other layer including 10–60% by weight of metal oxide.

As described above, according to the present invention, the change of resistance during firing of the resistor can be reduced by a factor of ¼ to 1/10 and the necessary power to attain an optical density of 1.0 can be reduced to no larger than 1 watt.

Embodiment 3

The glass paste used in the experiment consists of 100 parts by weight of glass frits, 3 parts by weight of ethyl cellulose (100 cps), 30 parts by weight of α-terpineol and 0–60 parts by weight of $Al_2O_3$ or BeO. The glass paste is prepared by previously mixing the glass frits with $Al_2O_3$ or BeO, blending the mixture with the α-terpineol solution of ethyl cellulose in a blender for 30 minutes and passing the resulting mixture through roll-mill (three times). Each of various glass paste (having different compounding ratios of $Al_2O_3$ or BeO) prepared in the manner described above is printed on the resistor 3 ($RuO_2$ thick-film resistor) of the thermal head shown in FIGS. 5 and 6 through a 250 mesh stainless steel screen, dried at 125° C. for 20 minutes and then fired at 650° C. to form the protective layer 4. The thickness of the glass layer after firing is approximately 10 μm. The wear resistance of the protective layer 4 and the change of resistance of the resistor by firing were examined for the samples thus formed. Thermal efficiency in printing as the thermal head was also examined. The heat insulating layer of the thermal head is identical to that used in the Embodiment 1.

Figure 10:
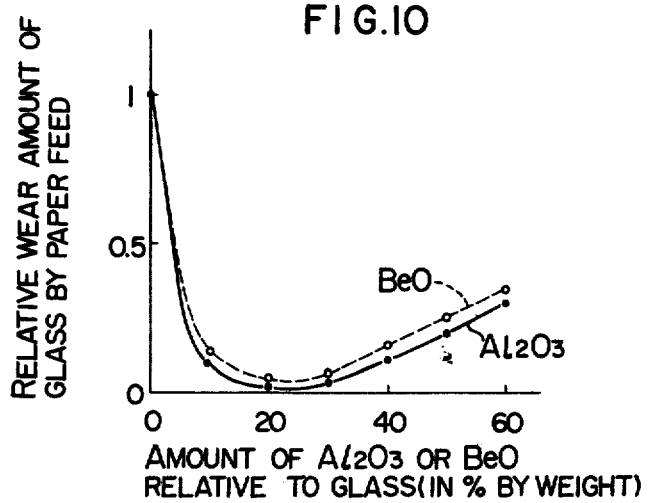

FIG. 10 shows plots illustrating a relation between the amount of $Al_2O_3$ or BeO added to the glass frits and the relative amount of wear of the glass by paper feed. It has been proved that the trend is the same for both $Al_2O_3$ addition and BeO addition and the addition of those considerably improves the wear resistance of the glass. When the surface of the protective layer 4 is rough, the printing paper is hard to be closely contacted to the protective layer 4 during printing and hence the thermal efficiency of printing decreases. Furthermore, when the surface of the protective layer 4 is rough, paper dregs remain on the surface and they acts as a heat insulation layer to decrease the thermal efficiency of printing. Accordingly, the roughness of the glass surface of the protective layer 4 must be approximately less than ±0.5 μm. It has also been proved that the surface roughness of the protective layer 4 including 10 to 40% by weight of $Al_2O_3$ or BeO to meet the requirement for wear resistance is less than ±0.5 μm and hence raises no problem. However, when the amount of $Al_2O_3$ or BeO added exceeds 40% by weight, the surface roughness increases and the problem described above is encountered. When the amount is less than 10% by weight, a practical problem occurs in connection with the wear resistance.

Figure 11:
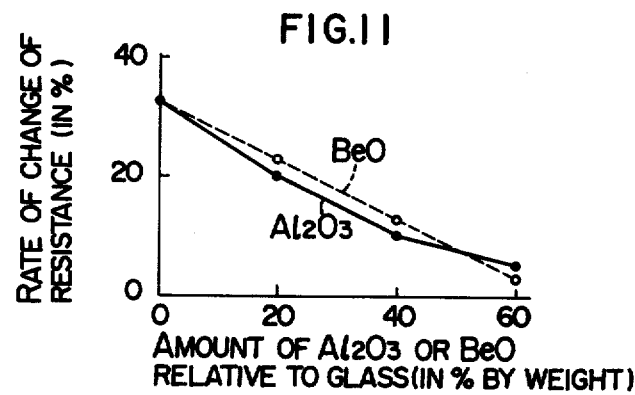

FIG. 11 shows the change of resistance of the heat generating resistor 3 due to firing of the glass paste. It is seen from FIG. 11 that as the amount of $Al_2O_3$ or BeO added increases, the change of resistance of the resistor 3 decreases. For example, when $Al_2O_3$ is added by 10% by weight and 40% by weight, the change of resistance is reduced by the factors of approximately 5/6 and ⅓, respectively, relative to that for the glass paste consisting of glass only. From the above, it has been proved that the present invention is also effective in reducing the change of resistance of the resistor 3 during the formation of the protective layer 4.

Figure 12:
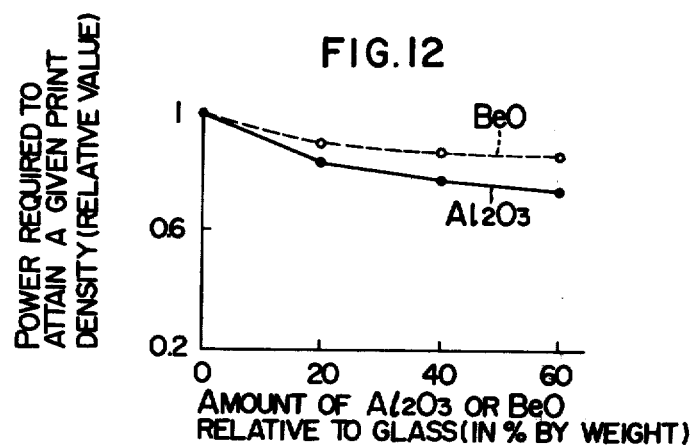

FIG. 12 shows power necessary for attaining a given printing density when glass layers including different amounts of $Al_2O_3$ or BeO are used as the protective layer 4 and the power is supplied to the resistor 3 to cause it to generate heat. It is seen from FIG. 12 that the more the amount of $Al_2O_3$ or BeO is added to the protective layer 4, the more is the necessary power required. For example, when $Al_2O_3$ is added by 10% by weight and 40% by weight, the power can be reduced by approximately 10% and 20%, respectively. Such an advantageous result is obtained because the heat conductivity of the glass of the present invention is higher than that of conventional one. For example, the glass including 30% by weight of $Al_2O_3$ has heat conductivity which is twice as high as that of the glass without addition of $Al_2O_3$.

While the addition of $Al_2O_3$ and BeO have been illustrated, it has been proved that a similar effect is attained when the combination of $Al_2O_3$ and BeO is added.

Embodiment 4

Figure 13:
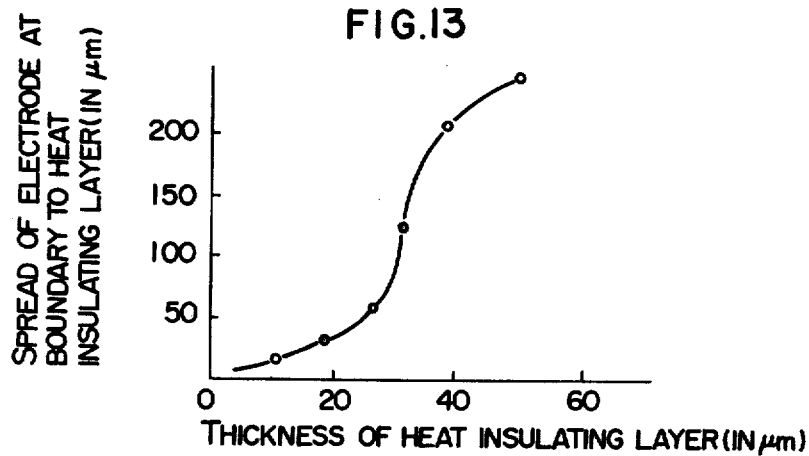

The glass paste identical to that used in the Embodiment 1 is screen printed on the alumina substrate 1 through screen plates made of 80-320 mesh stainless steel screens with stripe pattern of 6 mm width, and it is fired to form heat insulating layers of various thicknesses between 10 and 50 μm as shown in FIG. 7A or 7B. On those heat insulating layers, conductive paste (consisting of Ag powder, Pd powder, bismuth containing-lead borosilicate glass and α-terpineol solution of ethyl cellulose) is printed like in the case of FIG. 11 and fired to form electrodes having an electrode width of 80 μm and an electrode spacing of 85 μm. The relation between the thickness of the heat insulating layer and the spread of the electrode at the boundary to the heat insulation layer was examined. The results are shown in FIG. 13. As seen from FIG. 13, as the thickness of the heat insulation layer increases, the spread of the electrode at the boundary to the heat insulation layer increases. When the electrode spacing is 85 μm, the electrodes are shorted to each other as the thickness of the heat insulation layer exceeds approximately 37 μm.

In a usual thick-film thermal printer head, the electrode spacing differs depending on a printing dot density and a spacing of approximately 0.05 mm at minimum may be required. To meet this requirement, the electrode spread at the boundary to the heat insulating layer must be less than 50 μm. In this case, as seen from FIG. 10, the thickness of the heat insulation layer cannot help to be less than approximately 25 μm. On the other hand, as described above, thicker heat insulation layer is desirable from the viewpoint of heat utilization efficiency in printing, and a thickness of 80 μm at maximum is generally required. The inventors have discussed about the method for solving the above problems and finally invented the structure shown in FIGS. 5 and 6 in which the section of the heat insulation layer 7 is of stepped shape. In this structure, the difference between the heights of the respective steps is limited to no larger than 25 μm so that the spread of the electrode in each step can be limited to no larger than 50 μm. The thermal head having a stepped heat insulator section is formed in the following method. First, glass paste is printed on an alumina substrate 1 using a screen plate made of a 200 mesh stainless steel screen with a stripe pattern having a width of 5 mm, and it is dried and then fired to form a glass layer having a thickness of 20 μm. Then, the glass paste is overlap-printed through a screen plate made of a 200 mesh stainless steel screen with a stripe pattern having a width of 10 mm, with the center of the stripe pattern being coincided with the center of the previously formed 5 mm width glass layer, and it is dried and then fired. Thus, a two-step heat insulation layer having a center thickness of 40 μm is formed. When a thicker heat insulation layer is necessary, a screen plate having a wider stripe may be used to repeat the printing of the glass paste to increase the thickness to a desired one. Electrodes are printed on the heat insulation layer thus formed. It has been proved that the spread of the electrodes in each step is no larger than 50 μm and there is no short between the electrodes and hence the present invention is very effective.

We claim:
1. A thick-film thermal printing head comprising:

a substrate;

a heat insulating layer formed, on said substrate, of glass including 10 to 60% by weight of at least one metal oxide selected from the group consisting of $Al_2O_3$, MgO, $ZrO_2$, BeO and $TiO_2$;

plural pairs of electrodes formed over said heat insulating layer and said substrate, one electrode of each pair laterally opposing to the other on said heat insulating layer;

resistors formed between the opposing electrodes of the respective pairs for generating heat; and an abrasion protective layer formed of glass to completely cover said heat insulating layer and said electrodes and said resistors on said heat insulating layer.

2. A thick-film thermal printing head according to claim 1 wherein the glass of said heat insulating layer and the glass of said protective layer are made of glass selected from the group consisting of borosilicate glass, sodium containing-borosilicate glass, bismuth containing-borosilicate glass, lead borosilicate glass, sodium containing-lead borosilicate glass and bismuth containing-lead borosilicate glass.

3. A thick-film thermal printing head according to claim 1 wherein the thickness of said heat insulating layer is 10 to 80 $\mu$m and the thickness of said protective layer is 4 $\mu$m at minimum.

4. A thick-film thermal printing head according to claim 1 or claim 2 wherein the thickness of said heat insulating layer is thicker than 25 $\mu$m and 80 $\mu$m at maximum, said heat insulating layer is of at least two-step shape with the thickness of one step section adjacent to said substrate being equal to 10 to 25 $\mu$m and the thickness of each of the other step sections being no larger than 25 $\mu$m, and the thickness of said protective layer is 4 $\mu$m at minimum.

5. A thick-film thermal printing head according to claim 1 or claim 2 wherein the glass of said protective layer includes 10 to 40% by weight of at least one metal oxide selected from the group consisting of $Al_2O_3$ and BeO.

6. A thick-film thermal printing head comprising:
a substrate selected from the group consisting of an alumina substrate and a folsterite substrate;
a heat insulating layer of glass including 10 to 60% by weight of at least one metal oxide selected from the group consisting of $Al_2O_3$, MgO, $ZrO_2$, BeO and $TiO_2$, formed on said substrate to a thickness of 10 to 80 $\mu$m;
plural pairs of opposite electrodes formed over said heat insulating layer and said substrate;
$RuO_2$ resistors each of which is formed between the opposite electrodes of each pair; and
a protective layer formed of glass including 10 to 40% by weight of at least one metal oxide selected from the group consisting of $Al_2O_3$ and BeO to completely cover said heat insulating layer and said electrodes and said resistors on said heat insulating layer and having a thickness of at least 4 $\mu$m.

7. A thick-film thermal printing head according to claim 6 wherein the glass of said heat insulating layer and the glass of said protective layer are made of glass selected from the group consisting of borosilicate glass, Na containing-borosilicate glass, bismuth containing-borosilicate glass, lead borosilicate glass, Na containing-lead borosilicate glass and bismuth containing-lead borosilicate glass, the width of each of said electrodes is 0.05–1.0 mm and the spacing between adjacent electrodes is 0.05–1.0 mm.

8. A thick-film thermal printing head comprising:
a substrate selected from the group consisting of an alumina substrate and a folsterite substrate;
a heat insulating layer of glass including 10 to 60% by weight of at least one metal oxide selected from the group consisting of $Al_2O_3$, MgO, $ZrO_2$, BeO and $TiO_2$, formed on said substrate and having a thickness of between 25 $\mu$m and 80 $\mu$m, said heat insulating layer being of multi-step sectional configuration with the thickness of a first step directly overlying the substrate being equal to 10 to 25 $\mu$m and the thickness of each of the other steps being no larger than 25 $\mu$m;
a plurality of pairs of opposing electrodes formed over said heat insulating layer and said substrate;
$RuO_2$ resistors formed between the opposing electrodes of respective pairs; and
a protective layer of glass including 10 to 40% by weight of at least one metal oxide selected from the group consisting of $Al_2O_3$ and BeO, formed to completely cover said heat insulating layer and said electrodes and said resistors on said heat insulating layer and having a thickness of at least 4 $\mu$m.

9. A thick-film thermal printing head according to claim 8 wherein the glass of said heat insulating layer and the glass of said protective layer are made of glass selected from the group consisting of borosilicate glass, Na containing-borosilicate glass, bismuth containing-borosilicate glass, lead borosilicate glass, Na containing-lead borosilicate glass and bismuth containing-lead borosilicate glass, the width of each of the electrodes is 0.05 to 0.1 mm, the spacing between adjacent electrodes is 0.05 to 0.1 mm, and thickness of the resistor is 30 $\mu$m.

10. In a thick-film thermal printing head comprising a substrate, a plurality of pairs of opposite electrode conductors formed on the substrate, thick-film resistor regions for generating heat, such being formed on the substrate between the opposite electrode conductors of each pair, and an abrasion protective layer covering said electrode conductors and said resistor regions,
the improvement comprising a heat insulating layer formed of glass on said substrate and underlying said resistor regions and said electrode conductors, said heat insulating layer having a multi-layer structure,
only the nearmost layer to said resistor regions in said multi-layer structure being formed of glass containing 10 to 60% by weight of at least one metal oxide selected from the group consisting of $Al_2O_3$, MgO, $ZrO_2$, BeO and $TiO_2$.

11. The thick-film thermal printing head according to claim 10, wherein said multi-layer structure is of a double-layer structure having first and second layers contacting the substrate and the resistor regions, respectively, said first layer having a thickness of 10 to 25 $\mu$m, and formed of glass containing less than 10% by weight of said metal oxide, and the second layer having a thickness of no greater than 25 $\mu$m and formed of glass containing 10 to 60% by weight of said metal oxide.

12. A thick-film thermal printing head according to claim 2 wherein the thickness of said heat insulating layer is 10 to 80 $\mu$m and the thickness of said protective layer is 4 $\mu$m at minimum.

13. A thick-film thermal printing head according to claim 3 or claim 12 wherein the thickness of said heat insulating layer is thicker than 25 $\mu$m and 80 $\mu$m at maximum, said heat insulating layer is of at least two-step shape with the thickness of one step section adjacent to said substrate being equal to 10 to 25 μm and the thickness of each of the other step sections being no larger than 25 μm, and the thickness of said protective layer is 4 μm at minimum.

14. A thick-film thermal printing head according to claim 3 or claim 12 wherein the glass of said protective layer includes 10 to 40% by weight of at least one metal oxide selected from the group consisting of $Al_2O_3$ and BeO.

15. A thick-film thermal printing head according to claim 12 wherein the thickness of said heat insulating layer is thicker than 25 μm and 80 μm at maximum, said heat insulating layer is of at least two-step shape with the thickness of one step section adjacent to said substrate being equal to 10 to 25 μm and the thickness of each of the other step sections being no larger than 25 μm, and the thickness of said protective layer is 4 μm at minimum; the glass of said protective layer includes 10 to 40% by weight of at least one metal selected from the group consisting of $Al_2O_3$ and BeO.

16. A thick-film thermal printing head according to claim 6 wherein said electrodes are formed of a material selected from the group consisting of Au and Ag-Pd.

17. A thick-film thermal printing head according to claim 8 wherein said electrodes are formed of a material selected from the group consisting of Au and Ag-Pd.

* * * * *